United States Patent [19]

Maas et al.

[11] Patent Number: 5,039,623
[45] Date of Patent: * Aug. 13, 1991

[54] METHOD OF MANUFACTURING A SEMICONDUCTOR DEVICE

[75] Inventors: Henricus G. R. Maas; Roland A. Van Es; Johannes W. A. Van Der Velden, all of Eindhoven, Netherlands

[73] Assignee: U.S. Philips Corporation, New York, N.Y.

[ * ] Notice: The portion of the term of this patent subsequent to Jan. 1, 2008 has been disclaimed.

[21] Appl. No.: 504,187

[22] Filed: Apr. 3, 1990

[30] Foreign Application Priority Data

Apr. 5, 1989 [GB] United Kingdom ............... 8907611

[51] Int. Cl.[5] ................... H01L 21/331; H01L 21/22
[52] U.S. Cl. ......................................... 437/31; 437/33; 437/162; 437/909; 437/46; 437/158; 148/DIG. 10; 148/DIG. 31; 148/DIG. 44
[58] Field of Search .................... 437/31, 32, 33, 162, 437/909, 917, 46, 55, 158; 148/DIG. 10, DIG. 11, DIG. 96, DIG. 31, DIG. 44; 357/34, 35, 59 H

[56] References Cited

U.S. PATENT DOCUMENTS

| | | | |
|---|---|---|---|
| 4,757,027 | 7/1988 | Vora | 437/162 |
| 4,824,799 | 4/1989 | Komatsu | 437/31 |
| 4,851,362 | 7/1989 | Suzuki | 437/31 |
| 4,871,684 | 10/1989 | Glang et al. | 437/31 |

Primary Examiner—Brian E. Hearn
Assistant Examiner—Tuan Nguyen
Attorney, Agent, or Firm—Paul R. Miller

[57] ABSTRACT

A semiconductor body (10) has at one major surface (15) a step (14) defining a device area (13) of the semiconductor body above a buried region (12) provided within the semiconductor body (10). A protective insulating layer (24) is provided on a side wall (14a) of the step (14) and an insulating region (22) on an area (15a) of the one major surface adjoining the side wall (14a) of the step. Silicon is deposited over the one surface (15) with the anti-oxidation layer (24) on the side wall (14a) of the step (14) to define over the area (15a) of the one surface (15) an intermediate silicon region (23c) which is isolated from the side wall (14a) of the step and which leaves a window area (14'a) of the side wall (14a) exposed. The protective insulating layer (24a) is then removed from the window area (14'a) of the side wall (14a). A silicon region (25c) doped with impurities is defined over the insulating region (22) and adjoining the side wall (14a) of the step (14), and the dopant impurities caused to diffuse from the doped silicon region (25c) into the device area (13) via the window area (14'a) to define a contact region (28) for contacting a device region (29) within the device area (13).

14 Claims, 5 Drawing Sheets

METHOD OF MANUFACTURING A SEMICONDUCTOR DEVICE

DESCRIPTION

This invention relates to a method of manufacturing a semiconductor device, which method comprises providing a semiconductor body having at one major surface a step defining a device area of the semiconductor body above a buried region provided within the semiconductor body, providing a protective insulating layer on a side wall of the step, providing an insulating region on an area of the one surface adjoining the side wall of the step, defining a silicon region doped with impurities over the insulating region and adjoining the side wall of the step, and causing dopant impurities to diffuse from the doped silicon region into the device area via a window area of the side wall of the step to define a contact region within the device area for contacting a device region within the device area.

BACKGROUND OF THE INVENTION

Such a method may be used in, for example, the manufacture of a bipolar transistor when the buried region or layer forms part of the collector region and the device region is the base region to which the contact region makes a side wall contact. A paper entitled 'Fabrication process and device characteristics of side wall base contact structure transistor using two-step oxidation of side wall surface' by Katsuyoshi Washio, Tohru Nakamura and Tetsuya Hayashida published in the IEEE transactions on Electron Devices Vol. 35 No. 10, October 1988 at pages 1596 to 1600 describes such a method of manufacturing a bipolar transistor having a side wall base contact.

As discussed in the aforementioned paper, the dimensions of the window area of the side wall through which the impurities are diffused to define the contact area is particularly important as it defines the thickness of the base region. Moreover, if the contact region is formed too close to the buried collector region then the breakdown voltage of the transistor will be reduced while the base-collector capacitance will be increased, adversely affecting the high frequency performance of the transistor.

The aforementioned paper proposes a two-step oxidation process enabling a thicker insulating region, in particular an oxide region, to be formed so that the window area and therefore the base contact region is well spaced from the buried collector region.

As described in the paper, after formation of a first silicon dioxide insulating layer on the side wall and the area of the one major surface, a first protective layer in the form of an anti-oxidation silicon nitride layer is defined on the side wall of the step, the exposed area of the one major surface is then etched to form a deeper step and the new surface area surrounding the deeper step is oxidized to form a thicker second silicon oxide layer. A second silicon nitride layer is then provided on the first silicon nitride layer and the surface again oxidised to define the final isolation silicon oxide forming the insulating region.

Although the method described in the paper spaces the relatively thick insulating region from the device area defined by the step and therefore may avoid crystal defects within the device area which may otherwise be caused by the formation of a relatively thick oxide region, the two silicon nitride protective layers influence the dimensions of the side wall window area and the generation of defects. Moreover, the method is very complex and it is admitted in the paper that control of these protective layers is particularly important and that it is essential to determine the optimum thickness for the first and second silicon nitride protective layers. Indeed, the paper presents various SEM micrographs showing the problems which may arise if the thicknesses of the first and second silicon nitride layers are not optimised.

It is an aim of the present invention to provide a method of manufacturing a semiconductor device in which the dimensions and location of the window area can be controlled or adjusted so as to avoid undesirable increases in base-collector capacitance and to avoid a reduction of breakdown voltage without having to resort to the complicated process described in the aforementioned paper.

SUMMARY OF THE INVENTION

According to the present invention, there is provided a method of manufacturing a semiconductor device, which method comprises providing a semiconductor body having at one major surface a step defining a device area of the semiconductor body above a buried region provided within the semiconductor body, providing a protective insulating layer on a side wall of the step, providing an insulating region on an area of the one surface adjoining the side wall of the step, defining a silicon region doped with impurities over the insulating region and adjoining the side wall of the step, and causing dopant impurities to diffuse from the doped silicon region into the device area via a window area of the side wall of the step to define a contact region within the device area for contacting a device region within the device area, characterised by, prior to defining the doped silicon region, depositing silicon over the one surface with the anti-oxidation layer on the side wall of the step to define over the area of the one surface an intermediate silicon region which is isolated from the side wall of the step and which leaves the window area of the side wall exposed, removing the protective insulating layer from the exposed window area of the side wall and then depositing the silicon for defining the doped silicon region.

The use of a method embodying the invention enables a window area of small dimensions to be formed at the side wall of the step allowing the contact region formed by diffusion of impurities out of the doped silicon region into the device area to be well spaced from the buried region so as to avoid or reduce problems of excessive capacitance between the contact region and the buried region without having to resort to the growth of a thick insulating region which might otherwise induce stresses and strains and thereby cause crystal defects within the device area and without having to adopt the relatively complicated method described in the aforementioned paper which requires particularly precise control of the protective layer thicknesses. Also, a method embodying the invention may be used with any desired thickness of field oxide.

The intermediate silicon region may be defined by depositing the silicon as a layer so as to provide regions of silicon on the area of the one surface and the side wall and top surface of the step, introducing dopant impurities into the silicon layer so that the side wall silicon region is shielded from the dopant impurities and selectively removing the undoped side wall silicon region so as to result in a relatively flat intermediate silicon layer facilitating formation of the subsequent doped silicon region.

The protective insulating layer may be provided as an anti-oxidation layer and the intermediate silicon region may be oxidised after deposition. Where the intermediate silicon region is completely oxidised, it may be defined directly onto the area and may form the insulating region so avoiding the need for any oxide to be thermally grown on the area and so avoiding or at least reducing the possibility of stress and/or strain induced crystal defects during formation of the oxide layer.

The intermediate silicon region may alternatively be defined on top of the insulating region which may have previously been formed as a thermally grown oxide thereby enabling the thermally grown oxide to be thinner which should reduce the stresses and strains induced by the growth of the thermal oxide. In this case, the intermediate silicon region may be only partially oxidised leaving a silicon region underlying the oxide region.

In another embodiment, the intermediate silicon region may be defined by depositing a layer of silicon on the area and the side wall and top surface of the step, providing an anti-oxidation mask on the silicon region on the side wall, oxidising the exposed silicon regions on the area and the top surface, removing the anti-oxidation mask and then selectively removing the remaining silicon on the side wall so as to define the intermediate silicon region as a silicon oxide region.

In a further embodiment, the intermediate silicon region may be defined by providing the protective insulating layer as a layer of silicon nitride covered by a layer of silicon oxide, depositing a layer of silicon on the insulating region on the area, the protective insulating layer and the top surface of the step, introducing impurities into the silicon layer so that the silicon region adjacent the side wall covered by the protective layer remains undoped, selectively removing the undoped silicon region so as to define the intermediate silicon region on the area, removing the exposed silicon oxide layer using the remaining doped silicon region as a mask, then selectively removing the doped silicon regions and removing the thereby exposed silicon nitride using the remaining portion of the silicon oxide layer as a mask and then defining the doped silicon region on the insulating region so that a lower portion of the silicon region is isolated from the side wall of the step.

In this embodiment, the intermediate silicon region is not subjected to an oxidising treatment which might stress the semiconductor body but is removed after being used to define the isolation on the side wall of the step and then the silicon to form the doped silicon region deposited onto the insulating region.

In yet another embodiment, the intermediate silicon region may be defined as described above by introducing dopant impurities and then removing the undoped silicon side wall region and the silicon to form the doped silicon region deposited directly onto the doped intermediate silicon region without any potential stress and/or strain inducing oxidation process. In this case, the impurities for doping the doped silicon region may be implanted as described above or may be introduced by causing diffusion of dopant impurities out of the doped intermediate silicon region followed by selective removal of the undoped region or regions of the further silicon layer.

The intermediate silicon region may be formed by deposition of polycrystalline or amorphous silicon as also be the doped silicon region. In the case of the doped silicon region, where amorphous silicon is deposited there will usually then be a recrystallisation to form polycrystalline silicon during subsequent process steps, for example during diffusion of the dopant impurities.

BRIEF DESCRIPTION OF THE DRAWINGS

Embodiments of the invention will now be described, by way of example, with reference to the accompanying drawings, in which.

Figure 1:
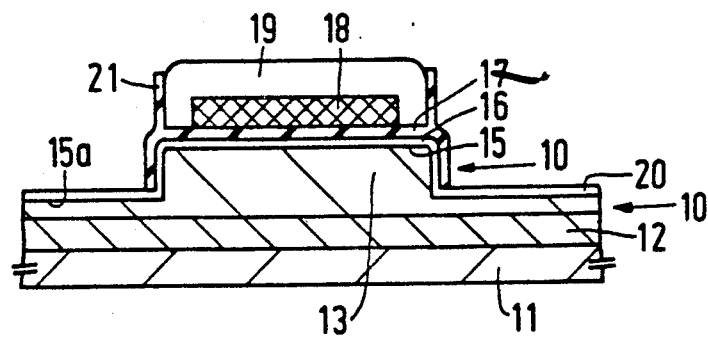
FIGS. 1, 2, 3, 4 and 5 are schematic cross-sectional views of a semiconductor body illustrating steps in the manufacture of a bipolar transistor using a method in accordance with the invention.

It should be understood that the Figures are merely schematic and are not drawn to scale. In particular certain dimensions such as. the thickness of layers or regions may have been exaggerated while other dimensions may have been reduced. It should also be understood that the same reference numerals are used throughout the Figures to indicate the same or similar parts.

DESCRIPTION OF THE INVENTION

Figure 4:
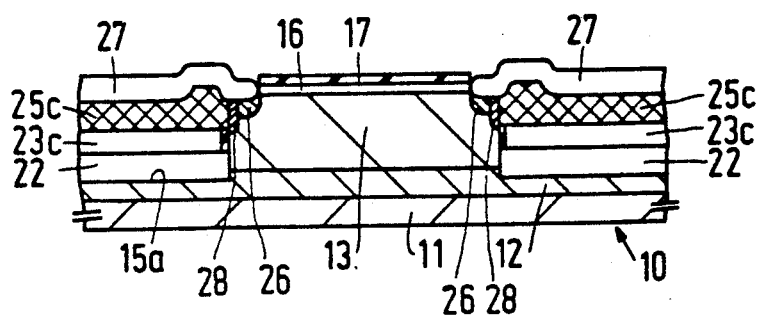

Referring now to the drawings, for example FIGS. 6 to 9, a method of manufacturing a semiconductor device comprises providing a semiconductor body 10 having at one major surface 15 (FIG. 1) a step 14 (FIG. 2) defining a device area 13 of the semiconductor body above a buried region 12 provided within the semiconductor body 10, providing a protective insulating layer 24 on a side wall 14a of the step 14, providing an insulating region 22 on an area 15a of the one major surface adjoining the side wall 14a of the step 14, defining a silicon region 25c doped with impurities over the insulating region 22 and adjoining the side wall 14a of the step 14, and causing dopant impurities to diffuse from the doped silicon region 25c into the device area 13 via a window area 14′a of the side wall 14a of the step 14 to define a contact region 28 (FIG. 4) within the device area 13 for contacting a device region 29 (FIG. 5) within the device area 13.

In accordance with the invention, prior to defining the doped silicon region 25c, silicon is deposited over the one surface 15 with the anti-oxidation layer 24 on the side wall 14a of the step 14 to define over the area 15a of the one surface 15 an intermediate silicon region 23c which is isolated from the side wall 14a of the step and which leaves the window area 14′a of the side wall 14a exposed, the protective insulating layer 24a is removed from the window area 14′a of the side wall 14a and then the silicon for defining the doped silicon region 25c is deposited. FIGS. 1 to 5 illustrate a method of manufacturing a bipolar transistor using a method in accordance with the invention.

Referring first to FIG. 1, the semiconductor body 10 comprises, in this example, a monocrystalline silicon substrate 11 doped with p conductivity type impurities into which n conductivity type impurities have been implanted to form the highly doped layer 12 which is subsequently covered by a lower doped n conductivity type epitaxial silicon layer 13 which will form the device area as will be described below. Typically, the epitaxial layer 13 may be about 1 micrometer thick and may have a dopant concentration of about $10^{16}$ atoms $cm^{-3}$.

The step 14 is defined at the one major surface 15 of the semiconductor body 10 in the following manner. First, a thin, for example about 50 nanometers (nm), insulating layer 16 of silicon oxide or silicon oxynitride is provided on the one major surface 15 followed by a first silicon nitride layer 17 having a thickness of about 100 nm to form an anti-oxidation layer and an undoped polycrystalline silicon layer 18 having a thickness of about 1.2 micrometers. Subsequently, the undoped polycrystalline silicon layer is defined by conventional photolithographic and etching processes and is subjected to a conventional thermal oxidation treatment to produce an oxide layer 19 on the remaining undoped polycrystalline silicon region 18.

The exposed regions of the insulating layer 16 and first silicon nitride layer 17 are then removed using a selective etching process, for example by etching preferably in a plasma or successively in hot phosphoric acid and in a buffered solution of HF in water.

A depression is then etched into the semiconductor body 10 using the oxide layer 19 as a mask. The depression may be in the form of a groove having a depth of about 0.8 micrometers so that, in this example, the groove does not extend into the buried layer 12. Although not shown in FIG. 1, the epitaxial layer 13 may be slightly under-etched to facilitate subsequent processing.

Figure 2:
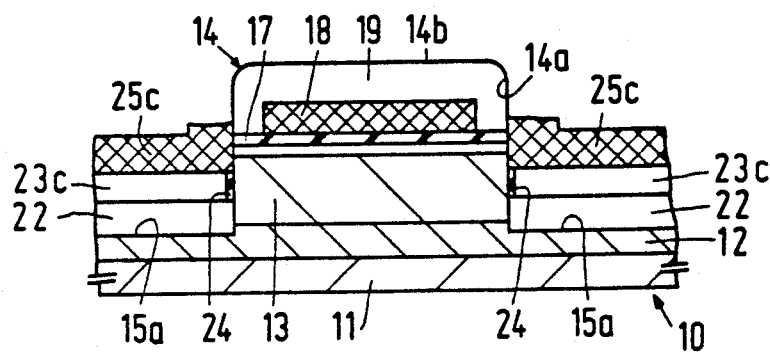

A further anti-oxidation layer comprising a silicon oxide layer 20 and a second silicon nitride layer is then provided. The silicon nitride layer is then etched anisotropically, for example using a carbon hydrofluoride plasma etching process, to remove the parts of the silicon nitride layer lying on surfaces parallel to the epitaxial layer 13 and the buried layer 12 so as to leave an anti-oxidation mask silicon nitride region 21 on the side wall 14a of the step 14 as shown in FIG. 1. The exposed silicon surfaces are then subjected to a conventional thermal oxidation treatment to form a first countersunk oxide region 22 (FIG. 2). The second anti-oxidation mask 21 may then be removed leaving the step 11 bounded by the countersunk oxide region 22 which in this example provides the area 15a of the one major surface 15 of the semiconductor body 10.

Using one of the methods to be described below, the intermediate silicon region 23c is then defined so as to be isolated from the side wall 14a of the step 14 by the protective insulating layer 24 (which may be provided on the side wall 14a either before or after the formation of countersunk oxide region 22) so as to leave the window area 14′a of the side wall 14a exposed. The exposed portion 24a of the protective insulating layer 24 is then removed prior to depositing, in the examples to be described, polycrystalline silicon for defining the doped silicon region 25c to produce a structure similar to that shown in FIG. 2. In the following examples, the polycrystalline silicon region 25c is doped with p-type impurities.

Figure 3:
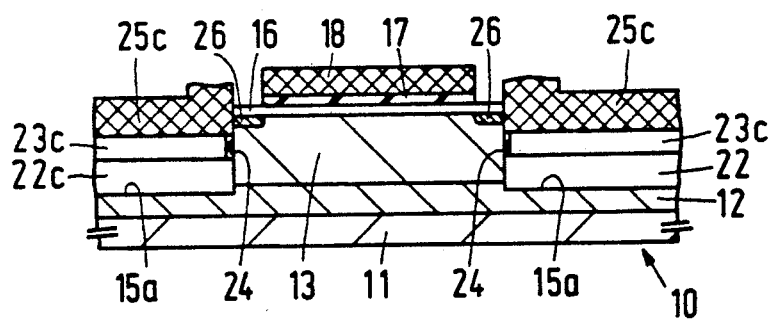

The oxide layer 19 and the exposed areas of the first silicon nitride layer 17, if still remaining after formation of the doped silicon region 25c, are then etched away and acceptor ions, for example boron ions, are implanted for defining a p conductivity type intermediate device region 26 adjoining the p-conductivity type polycrystalline silicon region 25c as shown in FIG. 3. Alternatively, the acceptor ions may be implanted after removal of the undoped polycrystalline silicon region 18 (described next).

The undoped polycrystalline silicon region 18 is then removed using an appropriate selective etchant, for example potassium hydroxide or sodium hydroxide as described above, and the exposed silicon is provided with a second oxide layer 27 by thermal oxidation in a manner similar to that used to form the countersunk oxide layer 22. During the high temperature processing to form the second oxide layer 27, the diffusion of p-type impurities out of the doped polycrystalline silicon region 25c results in the highly doped p-conductivity type contact region 28 between the doped polycrystalline silicon region 25c and the intermediate region 26 to produce the structure shown in FIG. 4.

Figure 5:
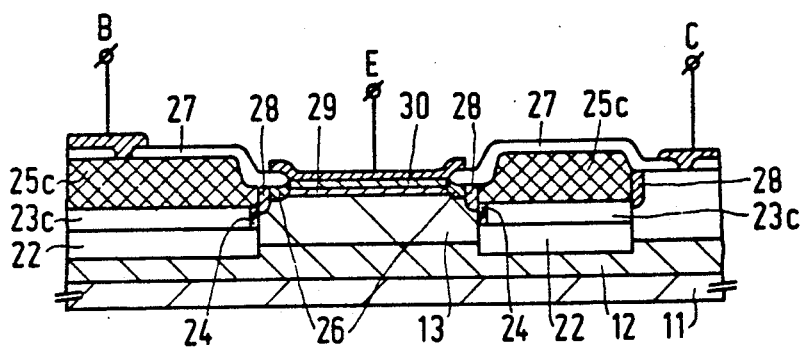

The remaining silicon oxide and silicon nitride layers 16 and 17 are then etched away and p-conductivity type impurities and subsequently n-conductivity type impurities are then implanted to form a p-conductivity type base region 29 which is connected via the intermediate device region 26 (which may be omitted if desired) and the contact region 28 to the doped polycrystalline silicon region 25c and an n-conductivity type emitter region 30 within the epitaxial layer 13 which itself forms part of the collector region with the buried region 12. Contact windows are then opened in the usual manner and metallisation applied to form the base B, emitter E and collector C contacts as shown in FIG. 5.

FIGS. 6 to 9 are enlarged views of part of the semiconductor body 10 illustrating a first embodiment of a method in accordance with the invention for enabling formation of the structure shown in FIG. 2, the dashed line A indicating an axis of symmetry of the structure shown in FIGS. 6 to 9.

Figure 6:
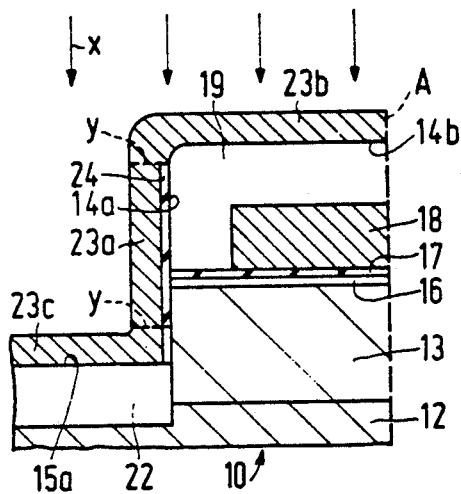
FIGS. 6, 7, 8 and 9 are enlarged schematic cross-sectional views of part of the semiconductor body shown in FIGS. 1 to 5 for illustrating a first embodiment of a method in accordance with the invention.

Referring first to FIG. 6, after formation of the countersunk oxide region 22 as described above, a layer of silicon nitride remains on the side wall 14a of the step to provide the protective insulating layer 24. As will become clear from the following description, in this example the protective insulating layer 24 forms an anti-oxidation layer.

A layer 23 of silicon is then deposited onto the area 15a and on the side wall 14a and a top surface 14b of the step. In this example, the deposited layer 23 forms a polycrystalline silicon layer having a thickness of about 200 nm (nanometers).

Boron ions are implanted into the surface of the polycrystalline silicon layer 23 as indicated by the arrows X in FIG. 6. The dose and energy of the boron ion implantation are selected so as to provide a boron ion concentration where the ions are implanted with an implantation dose greater than about $1.2 \times 10^{15}$ atoms cm$^{-2}$ to provide a surface concentration after diffusion of greater than about $6 \times 10^{19}$ atoms cm$^{-2}$. Where BF$_2^+$ ions are used then the implantation energy may be 120 KeV (kiloelectron volts) whereas where B$^+$ ions are used the implantation energy may be 30 KeV. Because of the anisotropic nature of the ion implantation as indicated by the arrows X, the ions are implanted into the surface of the polycrystalline regions 23b and 23c on the top surface 14b of the step 14 and on the area 15a but not to any significant extent into the polycrystalline silicon region 23a on the side wall 14a of the step which has a surface extending nearly parallel to the direction of implantation and is in effect shielded from the implantation by the polycrystalline silicon region 23b on the top surface 14b of the step.

After the implantation step, the semiconductor body 10 is subjected to a heat treatment to allow the implanted ions to diffuse into the polycrystalline silicon for a predetermined extent. In this example, the semiconductor body 10 may be heated to about 925 degrees Celsius for at least 45 minutes for this purpose, although the length of the diffusion time required will, of course, depend on the temperature selected and the thickness and structure of the polycrystalline silicon layer 23.

The length of the diffusion time should be selected so that there is very little diffusion of the implanted ions into the polycrystalline silicon region 23a on the side wall 14a of the step. In practice, the inventors have found that the length of the diffusion time is not that critical because, surprisingly, the rate at which the boron ions implanted into the polycrystalline silicon regions 23c and 23b diffuse into the polycrystalline silicon region 23a is significantly retarded with respect to the rate at which the implanted boron ions diffuse downwardly through the thickness of the polycrystalline silicon regions 23b and 23c. It is believed that this significant rate difference is related to the fact that diffusion of impurities across grain boundaries is more difficult and to the fact that the polycrystalline silicon grains tend to grow or be aligned so that the grain boundaries tend to be aligned perpendicularly to the underlying surface. Thus, the diffusion of the boron ions downwardly into the polycrystalline silicon regions 23b and 23c should be predominantly along grain boundaries while the diffusion direction required for the impurities to enter the polycrystalline silicon region 23a will be, predominantly, across the grain boundaries and so be lower.

The dashed lines Y in FIG. 6 illustrate approximately the extent of the diffusion of the boron ions after the above described diffusion process and thus show the extent of the undoped polycrystalline silicon region 23a on the side wall 14a of the step 14.

The exposed polycrystalline silicon layer 23 is then subjected to an etching process which selectively etches away the undoped polycrystalline silicon region 23a exposing the underlying part of the anti-oxidation layer 24a. Any suitable selective etchant may be used, for example potassium hydroxide or sodium hydroxide.

Figure 7:
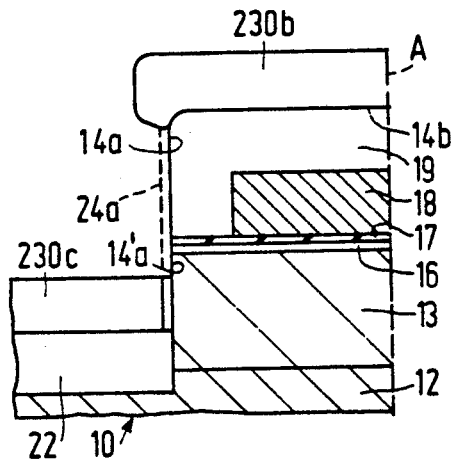

With the side wall 14a of the step 14 protected by the anti-oxidation layer 24, the doped polycrystalline silicon regions 23c and 23b are then subjected to an oxidation process in steam at 1000 degrees Celsius for 100 minutes, so that, in this example, the doped polycrystalline silicon regions 23c and 23b are completely oxidised to form oxide regions 230c and 230b as shown in FIG. 7. The thickness of the polycrystalline silicon layer 23 and the oxidising process are selected so that the surface of the oxide region 230c lies a distance below (for example 0.35 micrometers) the surface 13a of the device area 13 defined by the step 14 so that the window area 14'a is above the oxide region 230C.

Figure 8:
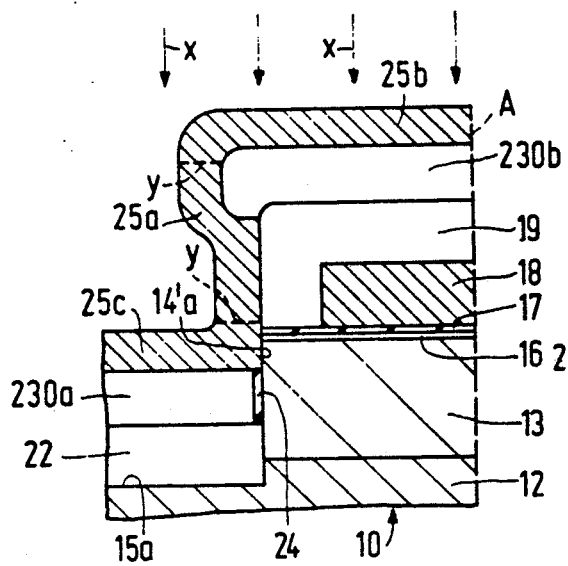
Figure 9:
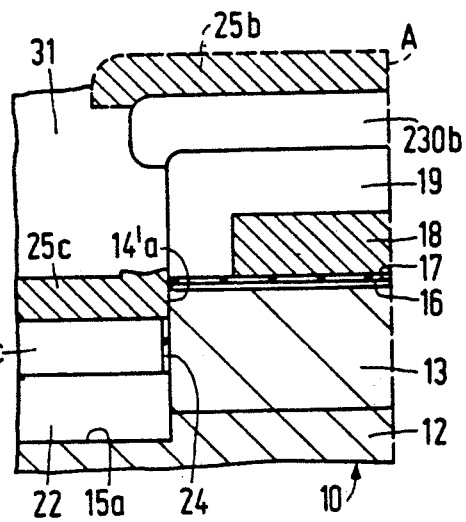

The exposed part 24a of the anti-oxidation layer (shown in phantom lines in FIG. 7 is then selectively removed, for example using H$_3$PO$_4$ and a further layer 25 of polycrystalline silicon with a thickness of about 0.6 micrometers is deposited to produce the structure shown in FIG. 8.

As indicated by the arrows X in FIG. 8, boron ions are then implanted into the further polycrystalline silicon layer 25 with an implantation dose of about 10$^{16}$ atoms cm$^{-2}$ and caused to to diffuse for 2 hours at 925 degrees Celsius.

The region 25a of the further polycrystalline silicon layer 25 bounded by the dashed lines Y in FIG. 8 thus remains undoped and can then be selectively etched away as described above, for example using potassium hydroxide or sodium hydroxide, to leave doped polycrystalline silicon regions 25b and 25c on the top surface 14b of the step and on the area 15a of the one major surface 15. The doped polycrystalline silicon region 25b (indicated in phantom lines in FIG. 9) may then be removed by first applying a flowable material, in this example a photosensitive resist, which is then patterned using conventional photolithographic and etching techniques to form a mask layer 31 leaving the doped polycrystalline silicon region 25b exposed. The doped polycrystalline silicon region 25b is then etched away. After removal of the mask layer 31 by conventional means, the structure shown in FIG. 2 is obtained and, for example, the steps described above with reference to FIGS. 3 to 5 can then be performed to result in the transistor structure shown in FIG. 5.

The use of the method described above with reference to FIGS. 6 to 9 enables the window area 14'a via which impurities are introduced from the doped silicon region 25c to be made relatively small in a controllable manner and moreover enables the aforementioned window area 14'a to be located at an upper region of the device area so that the contact region 28 when formed is well spaced from the buried collector region 12 to reduce the achieved window area without having to grow a very thick field oxide region 22 so that the stresses and strains and resulting crystal defects associated with very thick field oxide regions can be avoided or at least reduced. Typically, using the method described above the field oxide may be 0.7 micrometers thickness with the intermediate polycrystalline silicon region 23c being oxidized so that the oxide region 230c is about 0.4 micrometers thick, thereby providing an isolating composite oxide region of about 1.1 micrometers thickness.

Figure 10:
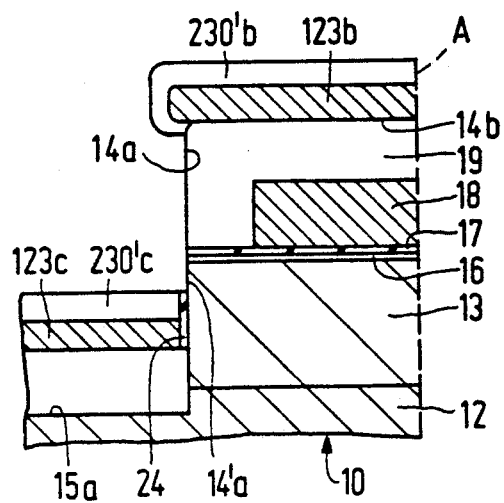
FIGS. 10 and 11 are enlarged schematic cross-sectional views similar to FIGS. 6 to 9 for illustrating a second embodiment of a method in accordance with the invention.
Figure 11:
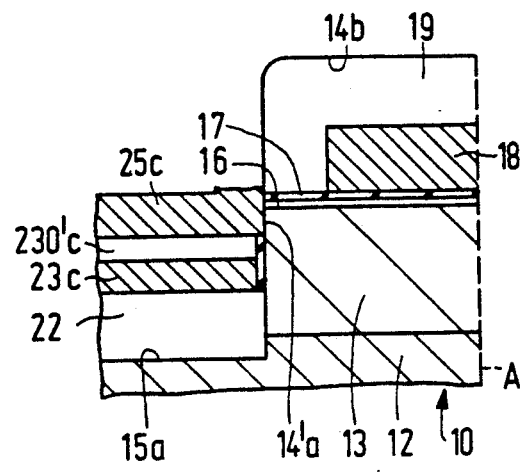

FIG. 10 and 11 illustrate a second embodiment of a method in accordance with the invention which is, in effect, a modification of the method described above with reference to FIGS. 6 to 9.

In this method after the deposition of the polycrystalline silicon layer 23, the subsequent boron implantation and selective etching of the undoped polycrystalline silicon region as described above with reference to FIG. 6, the remaining doped polycrystalline silicon regions 23b and 23c are only partially oxidised to leave, as shown in FIG. 10, doped polycrystalline silicon regions 123b and 123c beneath oxide regions 230'b and 230'c.

The further polycrystalline silicon layer 25 is then deposited as described above with reference to FIG. 8 and implanted with boron ions to enable the undoped polycrystalline silicon region 25a to be selectively etched away as described above using, for example, potassium hydroxide or sodium hydroxide.

A flowable material may then be applied to form a mask layer 25 as described above with reference to FIG. 9 enabling the oxide region 230'b and then the underlying doped polycrystalline silicon region 123b to be sequentially etched away using an HF:HNO₃ mixture to remove the doped polycrystalline silicon and buffered HF to remove the silicon oxide. This has the advantage of enabling the doped polycrystalline silicon region 123b to be used as an etch stop during removal of the oxide region 230'b and then allowing the doped polycrystalline silicon region 123b to be selectively etched away so that, as shown in FIG. 11, the step 14 has a similar structure both before and after the formation of the doped silicon region 25c. This arrangement enables relatively deep grooves to be filled with a thick silicon layer which, as it is only partially oxidised, causes less stress to the semiconductor body. As will be appreciated from FIG. 11, after removal of the doped polycrystalline silicon region 123b, the structure resembles that shown in FIG. 2 and the steps described above with reference to FIGS. 3 to 5 may then be carried out.

Figure 12:
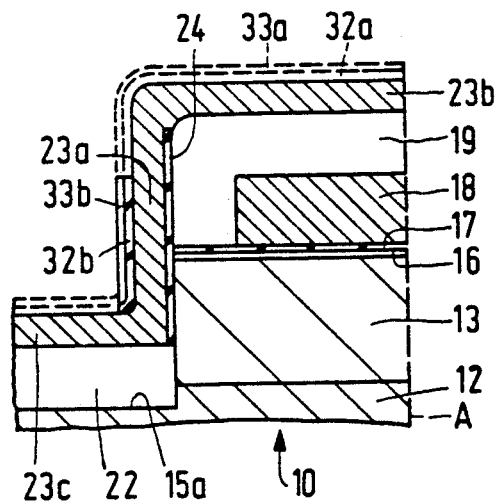
FIGS. 12 and 13 are enlarged schematic cross-sectional views similar to FIGS. 6 to 9 for illustrating a third embodiment of a method in accordance with the invention.
Figure 13:
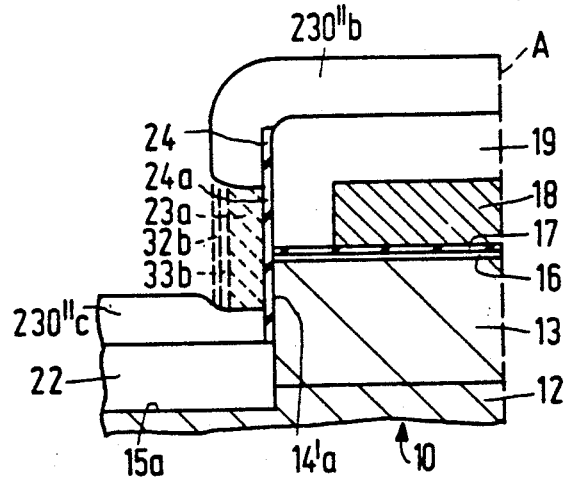

FIGS. 12 and 13 illustrate a third embodiment of a method in accordance with the invention in which, after deposition of the polycrystalline silicon layer 23 as shown in FIG. 6 to a thickness of about 100 nm, instead of implanting boron ions and then selectively etching away the undoped polycrystalline silicon, a thin silicon oxide layer 32 and then a thin silicon nitride layer 33 are deposited and subjected to an anisotropic etching process so removing the portions 32a and 33a shown in phantom lines in FIG. 12 and leaving the portions 32b and 33b of the silicon oxide and silicon nitride layers on the side wall of the step 14 to define a further anti-oxidation layer 32b, 33b. The polycrystalline silicon layer 23 is then subjected to an oxidation treatment similar to that described above so that the polycrystalline silicon regions 23b and 23c which are not protected by the anti-oxidation layer 32b, 33b are completely oxidised to form oxide regions 230"b and 230"c as shown in FIG. 13.

The silicon nitride portion 33b is then etched away using, for example, H₃PO₄ followed by the silicon oxide portion 32b and the remaining polycrystalline silicon region 23a is then selectively removed using potassium hydroxide to provide the structure shown in FIG. 13. After removal of the exposed portion 24a of the protective insulating layer 24, the method then proceeds as described above with reference to FIGS. 8 to 9.

Figure 14:
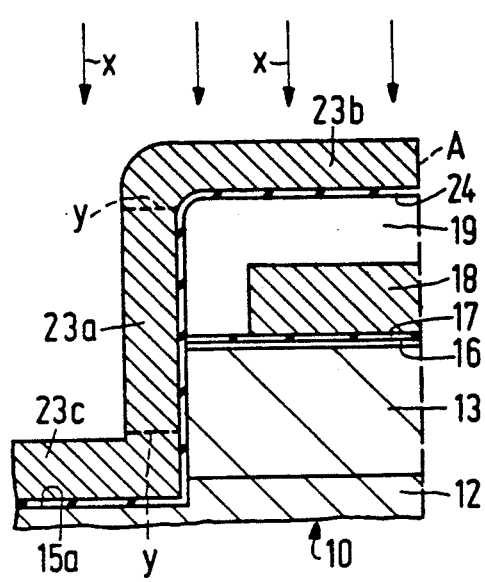
FIGS. 14 and 15 are enlarged schematic cross-sectional views similar to FIGS. 6 to 9 for illustrating a fourth embodiment of a method in accordance with the invention.
Figure 15:
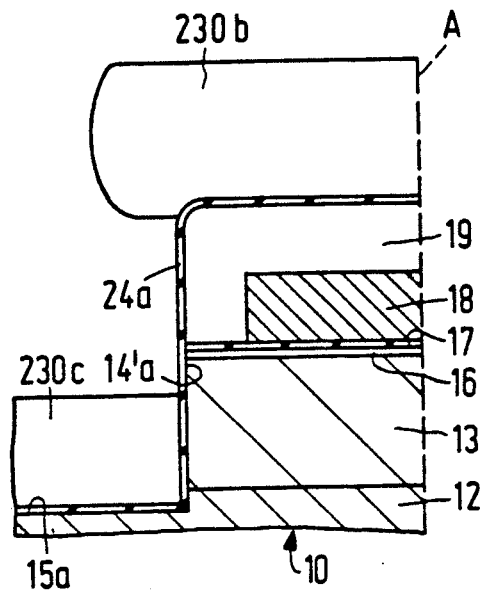

FIGS. 14 and 15 illustrate yet another method in accordance with the invention of providing a structure similar to that of FIG. 2. In this example, however, the countersunk oxide region 22 is not formed and the protective layer 24 is provided as a silicon nitride layer which covers the area 15a, and the side wall 14a and the top surface 14b of the step as shown in FIG. 14.

As described above, boron ions, indicated by the arrows X in FIG. 14 are implanted into the polycrystalline silicon layer 23 and the undoped polycrystalline silicon region 23a is then selectively etched away as described above. The remaining polycrystalline silicon regions 23b and 23c are then oxidised as described above with reference to FIG. 7 to produce the structure shown in FIG. 15 and, after removal of the exposed portion 24a of the protective insulating layer 24, the method then proceeds as described with reference to FIGS. 8 and 9 to produce a structure similar to that shown in FIG. 2 except that the field oxide region 22 is omitted.

Figure 16:
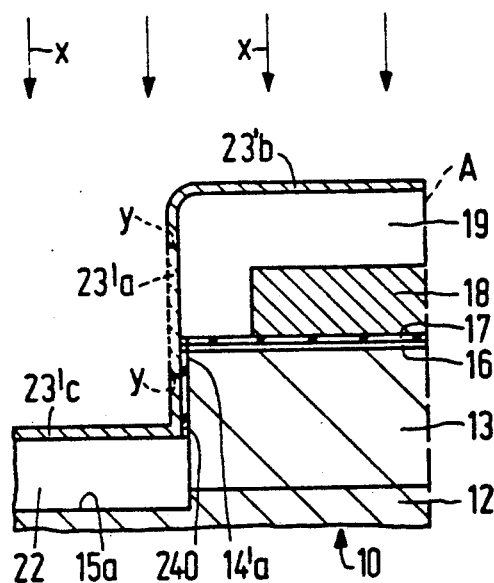
FIGS. 16 and 17 are enlarged schematic cross-sectional views similar to FIGS. 6 to 9 for illustrating a fifth embodiment of a method in accordance with the invention.
Figure 17:
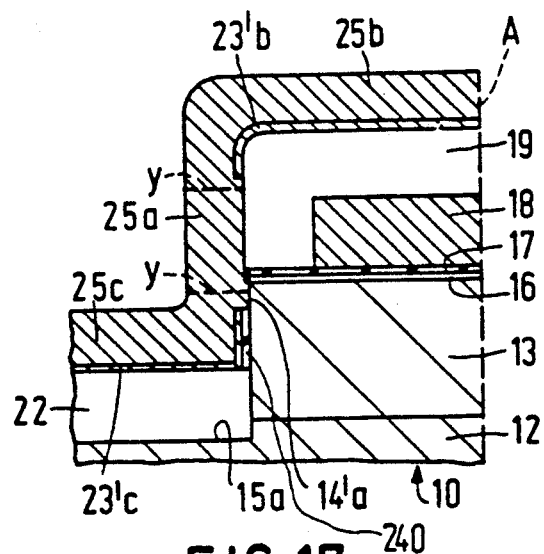

FIGS. 16 and 17 illustrate a further method in accordance with the invention.

In this example, a protective insulating layer 240 is provided as an anti-oxidation silicon nitride layer which remains after formation of the contersunk oxide region 22. In this example the silicon nitride layer may be etched anisotropically using a CF₄,CHF₃ and Argon plasma so as to extend over the side wall 13a of the epitaxial layer 13 but not onto the oxide region 19. Alternatively, the protective layer may be in the form of a thin thermal oxide grown on the side wall 13a of the epitaxial layer 13 after formation of the countersunk oxide region 22.

A thin, for example 0.3 micrometers thick, polycrystalline silicon layer 23' is then deposited to cover the area 15a, and the side wall 14a and top surface 14b of the step 14 and boron ions are implanted and diffused as described above to form doped polycrystalline silicon regions 23'b and 23'c leaving an undoped polycrystalline silicon region 23'a shown in phantom lines in FIG. 16 on the side wall 14a of the step which is then selectively etched away using, for example, potassium hydroxide or sodium hydroxide. The part of the silicon nitride layer 240 exposed on the window area 14'a is then selectively etched away and the further polycrystalline silicon layer 25 deposited as described above.

In this example the intermediate polycrystalline silicon region is not oxidised and the dopant impurities, in the example being described boron, may be introduced into the further polycrystalline silicon layer 25 by diffusion of impurities out of the doped polycrystalline silicon region 23c and/or by implantation as described above. The undoped side wall region 25a of the further polycrystalline silicon layer 25 shown in FIG. 17 is selectively etched away as described above. A flowable material may be applied to form a mask similar to the mask layer 31 shown in FIG. 9 either before the deposition of the further polycrystalline silicon layer 25 to enable removal of the doped polycrystalline silicon region 23b on the top surface 14b of the step 14 or, where the further polycrystalline silicon layer 25 is doped by implantation of impurities rather than solely by diffusion of impurities out of the doped intermediate silicon region, after implantation of the boron ions into the further layer 25 so as to enable removal of the doped polycrystalline silicon regions 23b and 25b so as to leave a structure similar to that shown in FIG. 2. The method described above with reference to FIGS. 3 to 5 may then be carried out to produce the transistor structure shown in FIG. 5.

Figure 18:
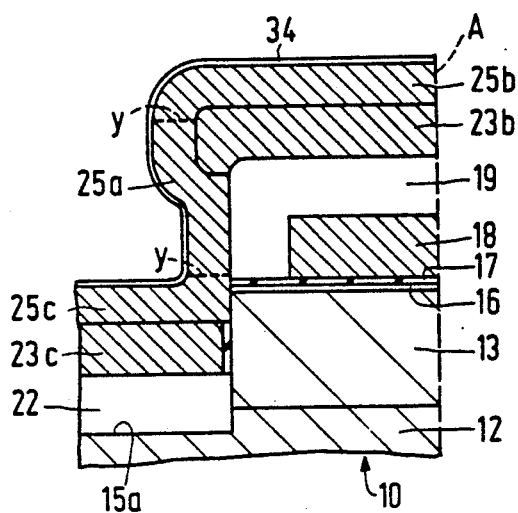
FIGS. 18 and 19 are enlarged schematic cross-sectional views similar to FIGS. 6 to 9 for illustrating a sixth embodiment of a method in accordance with the invention.
Figure 19:
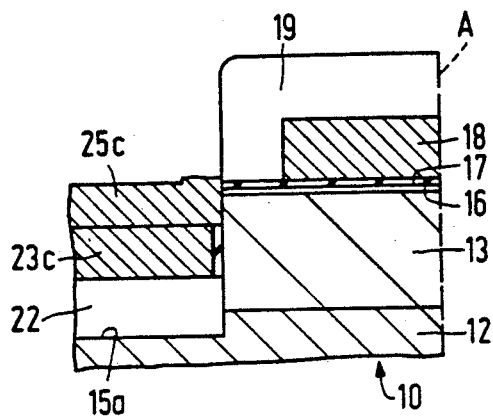

FIGS. 18 and 19 illustrate another embodiment of a method in accordance with the invention where the intermediate silicon region 23c is not oxidised prior to deposition of the further polycrystalline silicon layer 25.

In this example, the polycrystalline silicon layer 23 is deposited and then subjected to the steps described above with reference to FIG. 6 culminating in the removal of the undoped polycrystalline region 23a.

After this, however, the remaining doped polycrystalline silicon regions 23b and 23c are not oxidised but the further polycrystalline silicon layer 25 is deposited directly onto the doped polycrystalline silicon regions 23b and 23c and doping of the polycrystalline silicon regions 25b and 25c of the further layer is achieved by diffusion of impurities out of the doped regions 23b and 23c during which a thin thermal oxide 34 (FIG. 18) may grow on the further polycrystalline silicon layer 25. The undoped polycrystalline silicon region 25a is then removed as described above using an appropriate selective etchant. A flowable material mask similar to the mask layer 31 shown in FIG. 9 may then be applied to enable removal of the doped polycrystalline silicon region 23b and 25b. Alternatively, the doped polycrystalline silicon region 23b may be removed using a similar mask layer prior to deposition of the further polycrystalline silicon layer 25 so that the region 25b remains undoped and can be removed selectively with the undoped region 25a. In either case, the structure shown in FIG. 19 results and the method described above with reference to FIGS. 3 to 5 may then be carried out. As a further alternative, it may be possible to leave the doped polycrystalline silicon regions 23b and 25b in place and to selectively etch the oxide region 19 exposed by removal of the undoped polycrystalline silicon region 25a so as to lift off the doped polycrystalline silicon regions 23b and 25b resulting in a structure similar to that shown in FIG. 3.

Figure 20:
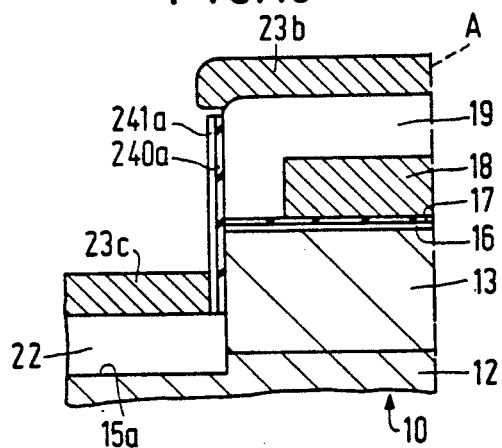
FIGS. 20, 21 and 22 are enlarged schematic cross-sectional views similar to FIGS. 6 to 9 for illustrating a seventh embodiment of a method in accordance with the invention.
Figure 21:
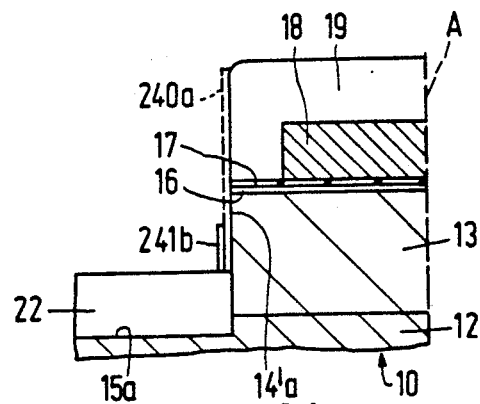
Figure 22:
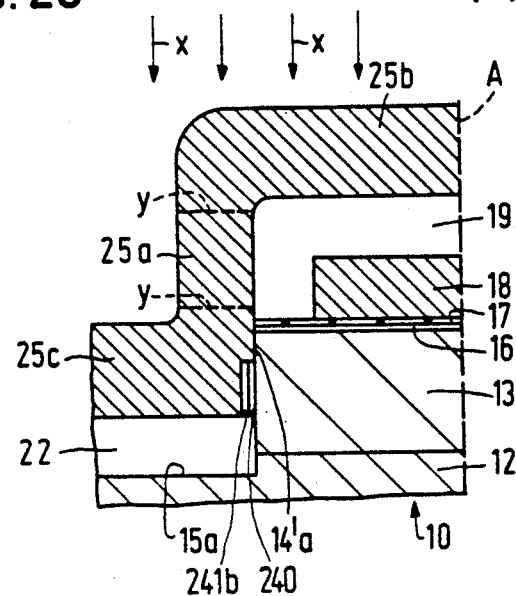

A further alternative method is illustrated in FIGS. 20 to 22 where the protective insulating layer 24 comprises a silicon nitride layer 240 and an overlying thin oxide layer 241. After deposition of the polycrystalline silicon layer 23, boron implantation and selective etching as described above, the exposed area 241a of the silicon oxide layer 241 shown in FIG. 20 is selectively etched away, followed by removal of the doped polycrystalline silicon regions 23b and 23c to produce the structure shown in FIG. 21. The exposed silicon nitride region 240a shown in phantom lines in FIG. 21 is then selectively etched with respect to the silicon oxide region 241b to define a protective insulating layer adjacent the side wall 13a of the epitaxial layer 13 as shown in FIG. 21 and then the further polycrystalline silicon layer 25 is deposited (FIG. 22) and doped as described above. The method, which is compatible with standard (deep groove) processing, then proceeds as described with reference to FIGS. 8 and 9.

It should be appreciated that although in each of the embodiments described above, the silicon layer 23 is deposited as a polycrystalline silicon layer, this layer could alternatively be formed as an amorphous silicon layer. It should also be understood that, although in the methods described above the silicon layer 13 is deposited as a polycrystalline silicon layer, it may alternatively be deposited as an amorphous layer and subsequently recrystallised for example during the heat treatment to cause diffusion of the implanted boron ions. It would also be possible to protect the side wall by oxidising the deposited polycrystalline silicon and then plasma etching to leave oxide only on the side wall. A conventional boron gas phase deposition could then be used to provide the doped region 25c. In addition, the use of dopant impurities other than boron ions may be possible if a suitable etchant which etches the undoped polycrystalline silicon selectively with respect to the doped polycrystalline silicon is available. Also the conductivity types given above could be reversed to enable, for example, a pnp bipolar transistor to be manufactured assuming an n conductivity type dopant and suitable etchant are available which enables selective etching of the undoped polycrystalline silicon.

Although the various embodiments have been described above with reference to the manufacture of an npn bipolar transistor of the type shown in FIG. 5, a method embodying the invention may be used in the manufacture of other types of side wall base contact bipolar transistors as described in our co-pending published European Patent Application Publication No. 0300514, corresponding to U.S. Pat. No. 4,894,702, and our co-pending European Patent Application No. 89200110.8 filed on Jan. 19th, 1989, corresponding to U.S. patent application Ser. No. 07/301,578, filed Jan. 24, 1989 and may also be used in the manufacture of insulated gate field effect transistors of the type described in European Patent Application No. 89200110.8. Indeed, a method embodying the invention may be used in any other suitable device where it is required to make contact to a device region by means of a doped relatively flat deposited silicon region.

From reading the present disclosure, other modifications will be apparent to persons skilled in the art. Such modifications may involve other features which are already known in the semiconductor art and which may be used instead of or in addition to features already described herein. Although claims have been formulated in this application to particular combinations of features, it should be understood that the scope of the disclosure of the present application also includes any novel features or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device comprising the steps of:
  (a) providing a step on at least one major surface of a semiconductor body, said step defining a device area above a buried region of said semiconductor body,
  (b) providing a protective insulating layer on a side wall of said step,
  (c) providing an insulating region on an area of said one major surface adjoining said side wall of said step,
  (d) depositing silicon over said one major surface and over said anti-oxidation layer on said side wall to define an intermediate silicon region over said area of said one major surface and over said step, said intermediate silicon region being isolated from said side wall,
  (e) removing said intermediate silicon region from said side wall to expose a region defining a window area of said side wall, (f) removing said protective insulating layer from said region at said window area of said side wall, thereby opening said window area to said side wall, (g) depositing silicon to define a silicon region doped with impurities over said insulating region adjoining said side wall of said step, and (h) diffusing said impurities from said silicon region into said device area through said exposed window area to form a contact region for contacting a device region of said device area.

2. A method according to claim 1, further characterised by doping the intermediate silicon region with impurities.

3. A method according to claim 2, further characterised by defining the intermediate silicon region by depositing the silicon as a layer so as to provide regions of silicon on said area of the one surface and the side wall and top surface of the step, introducing dopant impurities into the silicon layer so that the side wall silicon region is shielded from the dopant impurities and selectively removing the undoped side wall silicon region.

4. A method according to claim 3, further characterised by removing the top surface silicon region after masking the intermediate silicon region.

5. A method according to claim 1, further characterised by providing the protective insulating layer as an anti-oxidation layer.

6. A method according to claim 5, further characterised by oxidising the intermediate silicon region so as to form the insulating region prior to defining the doped silicon region.

7. A method according to claim 5, further characterised by depositing the silicon layer on top of the insulating region and at least partially oxidising the intermediate silicon region prior to defining the doped silicon region.

8. A method according to claim 1, further characterised by defining the intermediate silicon region by depositing a layer of silicon on said area and the side wall and top surface of the step, providing an anti-oxidation mask on the silicon region on the side wall, oxidising the exposed silicon regions on said area and the top surface, removing the anti-oxidation mask and then selectively removing the remaining silicon on the side wall so as to define the intermediate silicon region as a silicon oxide region.

9. A method according to claim 1, further characterised by defining the protective insulating layer as a layer of silicon nitride covered by a layer of silicon oxide, depositing a layer of silicon on the insulating region on said area, the protective insulating layer and a top surface of the step, introducing impurities into the silicon layer so that the silicon region adjacent the side wall covered by the protective layer remains undoped, selectively removing the undoped silicon region so as to define the intermediate silicon region on said area, removing the exposed silicon oxide layer using the remaining doped silicon regions as a mask, then selectively removing the doped silicon regions and removing the thereby exposed silicon nitride using the remaining portion of silicon oxide layer as a mask and then defining the doped silicon region on the insulating region so that a lower portion of the doped silicon region is isolated from the side wall of the step.

10. A method according to claim 1, further characterised by defining the doped silicon region by depositing a further layer of silicon covering said area of the one surface and the side wall and top surface of the step, introducing impurities into the further silicon layer so that the side wall silicon region of the further silicon layer remains undoped and selectively removing the undoped side wall region of the further silicon layer.

11. A method according to claim 2, further characterised by defining the doped silicon region by depositing a further layer of silicon covering the doped intermediate silicon region and the side wall and top surface of the step, causing impurities to diffuse out of the intermediate silicon region into the overlying region of the further silicon layer and selectively removing the undoped regions of the further silicon layer so as to leave the doped silicon region.

12. A method according to claim 1, further characterised by providing at least one of the doped and intermediate silicon regions by deposition of polycrystalline silicon.

13. A method according to claim 1, further characterised by providing the intermediate silicon region by deposition of amorphous silicon.

14. A method according to claim 1, further characterised by defining within the device area base and emitter regions so that said contact region connects the base region to the doped silicon region and the buried region forms at least part of a collector region of the semiconductor device.

* * * * *